(12) United States Patent
Chen

(10) Patent No.: US 9,350,406 B1
(45) Date of Patent: May 24, 2016

(54) TRANSCEIVER AND OPERATING METHOD THEREOF

(71) Applicant: UBIQ Semiconductor Corp., Zhubei, Hsinchu County (TW)

(72) Inventor: Chih-Hao Chen, Zhubei (TW)

(73) Assignee: UBIQ SEMICONDUCTOR CORP., Zhubei, Hsinchu County (TW)

( * ) Notice: Subject to any disclaimer, the term of this patent is extended or adjusted under 35 U.S.C. 154(b) by 0 days.

(21) Appl. No.: 14/737,402

(22) Filed: Jun. 11, 2015

(30) Foreign Application Priority Data

Jan. 15, 2015 (TW) .............................. 104101377 A

(51) Int. Cl.
*H04B 1/38* (2015.01)
*H04L 12/40* (2006.01)
*H04B 17/18* (2015.01)
*H04B 17/19* (2015.01)

(52) U.S. Cl.
CPC .................. *H04B 1/38* (2013.01); *H04B 17/18* (2015.01); *H04B 17/19* (2015.01); *H04L 12/40* (2013.01)

(58) Field of Classification Search
CPC . H04B 1/38; G06K 19/0712; G06K 19/0716; G06F 11/273; G06F 13/385; G06F 13/387; G06F 1/3215; H04L 12/40; H04L 43/50; H04L 5/1446; H04L 5/16; H01L 2224/49171; H01L 2224/73265; H01L 23/3128
USPC ........... 709/245, 246, 47, 234, 236, 203, 204, 709/208, 213, 224, 235, 250, 253; 375/219, 375/224; 710/106, 305, 58, 65, 100, 105, 710/33, 35, 52, 60; 455/78; 370/282, 297
See application file for complete search history.

(56) References Cited

U.S. PATENT DOCUMENTS

| | | | |
|---|---|---|---|
| 5,652,528 A | 7/1997 | Kimura et al. | |
| 5,811,997 A | 9/1998 | Chengson et al. | |
| 5,974,570 A * | 10/1999 | Kawaguchi ........... | G06F 11/167 714/42 |
| 6,624,661 B2 | 9/2003 | Chang et al. | |
| 8,736,307 B2 | 5/2014 | Pimentel et al. | |
| 2007/0005872 A1 | 1/2007 | Kinoshita | |

FOREIGN PATENT DOCUMENTS

CN 103631226 A 3/2014

* cited by examiner

*Primary Examiner* — Rahel Guarino
(74) *Attorney, Agent, or Firm* — McClure, Qualey & Rodack, LLP

(57) ABSTRACT

A transceiver and a transceiver operating method are disclosed. The transceiver is coupled to a bus. The transceiver includes a receiving unit, a transmitting unit, and a detection unit. The receiving unit is coupled to the bus. The transmitting unit is coupled to the bus. The detection unit is coupled to the receiving unit and the transmitting unit respectively. The detection unit receives a first input signal, a receiver enabling signal, and a transmitter enabling signal respectively and selectively enhances the first input signal and the transmitter enabling signal according to a result of comparing the receiver enabling signal and the transmitter enabling signal. Then, the detection unit transmits the enhanced first input signal and transmitter enabling signal to the bus through the transmitting unit.

12 Claims, 11 Drawing Sheets

TRANSCEIVER AND OPERATING METHOD THEREOF

BACKGROUND OF THE INVENTION

1. Field of the Invention

The invention relates to a transceiver; in particular, to a transceiver and a transceiver operating method capable of transmitting signal in high speed and cooperating with isolators of different numbers.

2. Description of the Prior Art

In general, when two electronic apparatus communicate with each other, because different electronic apparatus may use different communication protocols to transmit signals, one electronic apparatus usually selects a transceiver corresponding to its communication protocol to normally communicate with the other electronic apparatus.

In practical applications, as shown in FIG. 1, in order to prevent high energy impact and interference from outside, isolators ISO1 and ISO 2 can be disposed between a micro-processor MCU1 and a transceiver TR1 and between a micro-processor MCU2 and a transceiver TR2 respectively, so that the micro-processors MCU1 and MCU2 can be completely protected.

Taking the transceiver TR1 for example, as shown in FIG. 2, the basic transceiver TR1 at least includes a receiver RX and a transmitter TX. Wherein, an input pin IN of the receiver RX and an output pin OUT of the transmitter TX are interfaces to external communication protocols; an output pin R_OUT of the receiver RX and an input pin T_IN of the transmitter TX are signal transmission interfaces to inner units such as the micro-processor MCU1.

Please refer to FIG. 3. In order to reduce the configuration cost of the external transmission interface, enabling pins R_EN and T_EN are disposed in the receiver RX and the transmitter TX of the half-duplex transceiver TR1 for receiving enabling signals from inside respectively. By doing so, the receiver RX and the transmitter TX can share the external transmission lines through the input/output pin IN/OUT to reduce the system configuration cost.

However, as shown in FIG. 3, because two enabling pins R_EN and T_EN are added, more control signals are transmitted from the micro-processor MCU1, and the half-duplex transceiver TR1 having the push-pull configuration needs four isolators ISO1~ISO4. These four isolators ISO1~ISO4 will not only occupy more space, but also increase the entire cost of the transceiver.

SUMMARY OF THE INVENTION

Therefore, the invention provides a transceiver and a transceiver operating method to solve the above-mentioned problems occurred in the prior arts.

A preferred embodiment of the invention is a transceiver. In this embodiment, the transceiver is coupled to a bus. The transceiver includes a receiving unit, a transmitting unit, and a detection unit. The receiving unit is coupled to the bus. The transmitting unit is coupled to the bus. The detection unit is coupled to the receiving unit and the transmitting unit respectively. The detection unit receives a first input signal, a receiver enabling signal, and a transmitter enabling signal respectively and selectively enhances the first input signal and the transmitter enabling signal according to a comparing result of comparing the receiver enabling signal and the transmitter enabling signal. Then, the detection unit transmits the enhanced first input signal and the enhanced transmitter enabling signal to the bus through the transmitting unit.

In an embodiment of the invention, the detection unit includes a comparing circuit and an enhancement determining circuit. The comparing circuit is used for receiving the receiver enabling signal and the transmitter enabling signal respectively and generating the comparing result according to whether the receiver enabling signal and the transmitter enabling signal are isoelectric. The enhancement determining circuit is coupled to the comparing circuit, the receiving unit, and the transmitting unit respectively. The enhancement determining circuit is for determining whether the first input signal should be enhanced and a voltage level that the first input signal should be enhanced to according to the comparing result.

In an embodiment of the invention, if the receiver enabling signal and the transmitter enabling signal are not isoelectric, the enhancement determining circuit determines that the first input signal should not be enhanced and then outputs the first input signal; if the receiver enabling signal and the transmitter enabling signal are isoelectric, the enhancement determining circuit determines that the first input signal should be enhanced and enhances the first input signal and the transmitter enabling signal, then the enhancement determining circuit outputs the enhanced first input signal and the enhanced transmitter enabling signal.

In an embodiment of the invention, the transceiver further includes a selector. The selector is coupled between the enhancement determining circuit and the transmitting unit and used for selectively transmitting the first input signal or the enhanced first input signal and the transmitter enabling signal or the enhanced transmitter enabling signal outputted by the enhancement determining circuit to the transmitting unit.

In an embodiment of the invention, the receiving unit receives a second input signal through the bus, when the enhancement determining circuit enhances the first input signal, the enhancement determining circuit determines that a configuration of the bus is push-high or pull-low according to the second input signal, if the enhancement determining circuit determines that the configuration of the bus is push-high, the enhancement determining circuit enhances a rising edge of the first input signal; if the enhancement determining circuit determines that the configuration of the bus is pull-low, the enhancement determining circuit enhances a falling edge of the first input signal.

In an embodiment of the invention, the detection unit further includes a pull-up circuit and/or a pull-down circuit coupled to a receiving terminal of the comparing circuit.

In an embodiment of the invention, the detection unit is operated in a normal configuration, an open drain pull configuration, an open drain push configuration, or a differential open drain configuration.

Another embodiment of the invention is a transceiver operating method. In this embodiment, the transceiver operating method is used for operating a transceiver. The transceiver is coupled to a bus. The transceiver includes a receiving unit and a transmitting unit. The receiving unit and the transmitting unit are coupled to the bus respectively. The transceiver operating method includes steps of: (a) comparing a receiver enabling signal with a transmitter enabling signal to generate a comparing result, wherein the receiver enabling signal and the transmitter enabling signal are received by the transceiver; and (b) selectively enhancing the first input signal and the transmitter enabling signal according to the comparing result and then transmitting the enhanced first input signal and the enhanced transmitter enabling signal to the bus.

Compared to the prior arts, no matter the transceiver of the invention is used in a system having no isolator or having isolators of different numbers, the transceiver and the transceiver operating method of the invention can automatically detect the configuration out of the transceiver and dynamically enhance the signal accordingly to achieve high-speed signal transmission. By doing so, the transceiver and the transceiver operating method of the invention can effectively improve the drawback of slow signal transmission rate when the conventional transceiver is operated in the open drain configuration; therefore, the transceiver and the transceiver operating method of the invention can achieve the effects of reducing costs and high-speed signal transmission at the same time.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
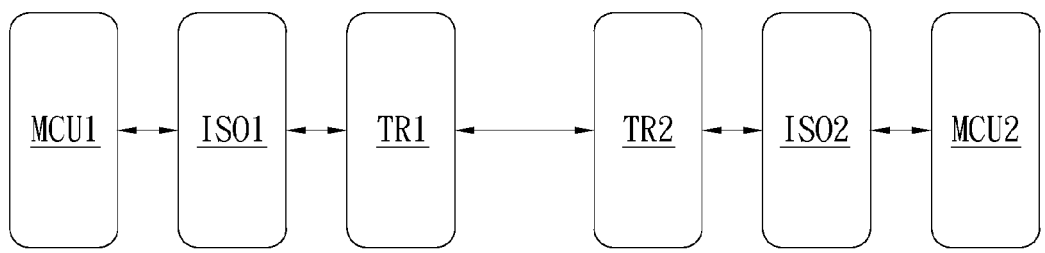
FIG. 1 illustrates a schematic diagram of the isolators disposed between the conventional transceiver and micro-processor.
Figure 2:
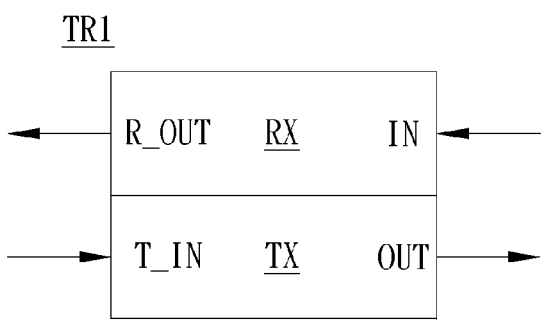
FIG. 2 illustrates a schematic diagram of the basic structure of the transceiver.
Figure 3:
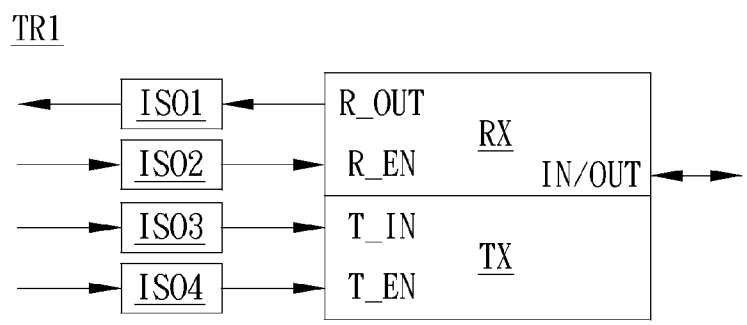
FIG. 3 illustrates a schematic diagram of the half-duplex transceiver having a push-pull configuration cooperated with the isolators.

Exemplary embodiments of the present invention are referenced in detail now, and examples of the exemplary embodiments are illustrated in the drawings. Further, the same or similar reference numerals of the elements/components in the drawings and the detailed description of the invention are used on behalf of the same or similar parts. In the following embodiments, if an element is "connected" or "coupled" to another element, the element may be directly connected or coupled to the another element, or there may be any elements or specific materials (e.g., colloid or solder) disposed between the element and the another element.

A preferred embodiment of the invention is a transceiver. In this embodiment, the transceiver is a half-duplex transceiver operated in the open drain configuration and used to transmit and receive all kinds of signals. It has advantages of low cost and high transmission rate and has high elasticity to use. No matter whether the transceiver of the invention is cooperated with isolators or how many isolators the transceiver of the invention is cooperated with, the transceiver of the invention can reach high transmission rate and it can be a single-ended type transceiver or a differential type transceiver without specific limitations.

Figure 4:
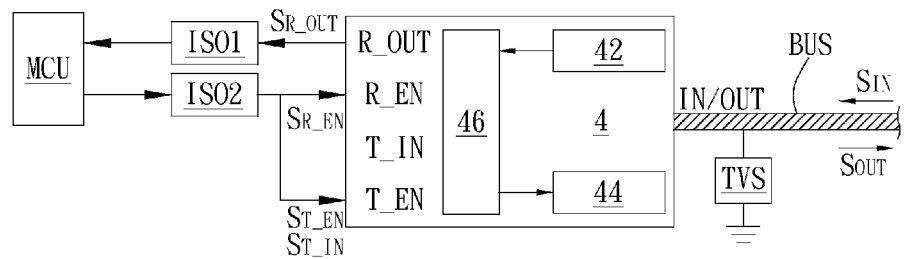
FIG. 4 illustrates a schematic diagram of the half-duplex transceiver cooperated with the isolators.

Please refer to FIG. 4. FIG. 4 illustrates a schematic diagram of the half-duplex transceiver cooperated with the isolators. As shown in FIG. 4, the half-duplex transceiver 4 is coupled to a first isolator ISO1 and a second isolator ISO2 respectively. The first isolator ISO1 and the second isolator ISO2 are coupled to a micro-processor MCU respectively. The half-duplex transceiver 4 is also coupled to a bus BUS, and a transient voltage suppressor TVS is coupled on the bus BUS. The half-duplex transceiver 4 includes a receiving unit 42, a transmitting unit 44, and a detecting unit 46. Wherein, the receiving unit 42 is coupled to the bus BUS. The transmitting unit 44 is coupled to the bus BUS. The detecting unit 46 is coupled to the receiving unit 42 and the transmitting unit 44 respectively.

The half-duplex transceiver 4 has an input/output pin IN/OUT, a receiver output pin R_OUT, a receiver enabling pin R_EN, a transmitter input pin T_IN, and a transmitter enabling pin T_EN. Wherein, the input/output pin IN/OUT is coupled to the bus BUS, and the input/output pin IN/OUT receives an input signal $S_{IN}$ from outside and transmits an output signal $S_{OUT}$ to outside through the bus BUS; the receiver output pin R_OUT is coupled to the first isolator ISO1 and the receiver output pin R_OUT outputs a receiver output signal $S_{R\_OUT}$ to the micro-processor MCU through the first isolator ISO1; the receiver enabling pin R_EN is coupled to the second isolator ISO2 and the receiver enabling pin R_EN receives a receiver enabling signal $S_{R\_EN}$ from the micro-processor MCU through the second isolator ISO2; the transmitter enabling pin T_EN is coupled to the second isolator ISO2 and the transmitter enabling pin T_EN receives a transmitter enabling signal $S_{T\_EN}$ and a transmitter input signal $S_{T\_IN}$ from the micro-processor MCU through the second isolator ISO2.

Figure 5:
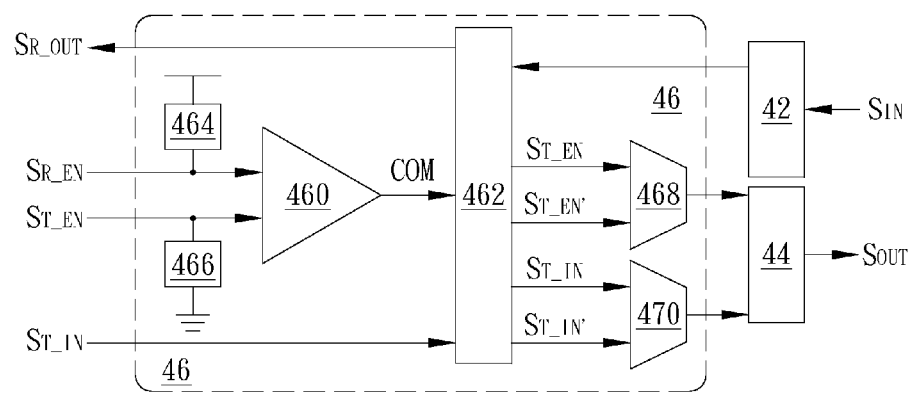
FIG. 5 illustrates a detailed schematic diagram of the detection unit of FIG. 4.

Then, please refer to FIG. 5. FIG. 5 illustrates a detailed schematic diagram of the detection unit 46 of FIG. 4. As shown in FIG. 5, the detection unit 46 includes a comparator 460, an enhancement determining circuit 462, a pull-up circuit 464, a pull-down circuit 466, and two selectors 468 and 470. Wherein, the pull-up circuit 464 and the pull-down circuit 466 are coupled to two input terminals of the comparator 460 respectively; an output terminal of the comparator 460 is coupled to the enhancement determining circuit 462; the receiving unit 42 is coupled to the enhancement determining circuit 462; the enhancement determining circuit 462 is coupled to the selectors 468 and 470 respectively; the selectors 468 and 470 are coupled to the transmitting unit 44 respectively.

The comparator 460 receives the receiver enabling signal $S_{R\_EN}$ and the transmitter enabling signal $S_{T\_EN}$ through its two input terminals respectively and generates a comparing result COM according to whether the receiver enabling signal $S_{R\_EN}$ and the transmitter enabling signal $S_{T\_EN}$ are isoelectric. And then, the comparator 460 transmits the comparing result COM to the enhancement determining circuit 462.

The enhancement determining circuit 462 receives an input signal $S_{IN}$ from outside of the receiving unit 42 and outputs a receiver output signal $S_{R\_OUT}$. In addition, the enhancement determining circuit 462 also receives the transmitter input signal $S_{T\_IN}$ and the comparing result COM, and the enhancement determining circuit 462 determines whether the transmitter input signal $S_{T\_IN}$ should be enhanced and a voltage level that the transmitter input signal $S_{T\_IN}$ should be enhanced to according to the comparing result COM.

In this embodiment, the enhancement determining circuit 462 will transmit the original transmitter input signal $S_{T\_IN}$ and the enhanced transmitter input signal $S_{T\_IN}'$ to the selector 470 respectively, and transmit the original transmitter enabling signal $S_{T\_EN}$ and the enhanced transmitter enabling signal $S_{T\_EN}'$ to the selector 468 respectively. If the receiver enabling signal $S_{R\_EN}$ and the transmitter enabling signal $S_{T\_EN}$ are isoelectric, the enhancement determining circuit 462 determines that the transmitter input signal $S_{T\_IN}$ should be enhanced, and then the transmitting unit 44 will generate the output signal $S_{OUT}$ according to the enhanced transmitter enabling signal $S_{T\_EN}'$ and the enhanced transmitter input signal $S_{T\_IN}'$ and transmit the output signal $S_{OUT}$ to outside. If the receiver enabling signal $S_{R\_EN}$ and the transmitter enabling signal $S_{T\_EN}$ are not isoelectric, the enhancement determining circuit 462 determines that the transmitter input signal $S_{T\_IN}$ should not be enhanced, the selectors 468 and 470 will transmit the original transmitter enabling signal $S_{T\_EN}$ and the transmitter input signal $S_{T\_IN}$ to the transmitting unit 44 respectively, and then the transmitting unit 44 will generate the output signal $S_{OUT}$ according to the original transmitter enabling signal $S_{T\_EN}$ and the original transmitter input signal $S_{T\_IN}$ and transmit the output signal $S_{OUT}$ to outside.

In practical applications, the detection unit 46 can also have no selectors, and the detection unit 46 can selectively transmit the original transmitter enabling signal $S_{T\_EN}$ and the original transmitter input signal $S_{T\_IN}$ to the transmitting unit 44 or transmit the enhanced transmitter enabling signal $S_{T\_EN}'$ and the enhanced original transmitter input signal $S_{T\_IN}'$ to the transmitting unit 44 according to the result of determining whether the transmitter input signal $S_{T\_IN}$ should be enhanced.

Figure 6:
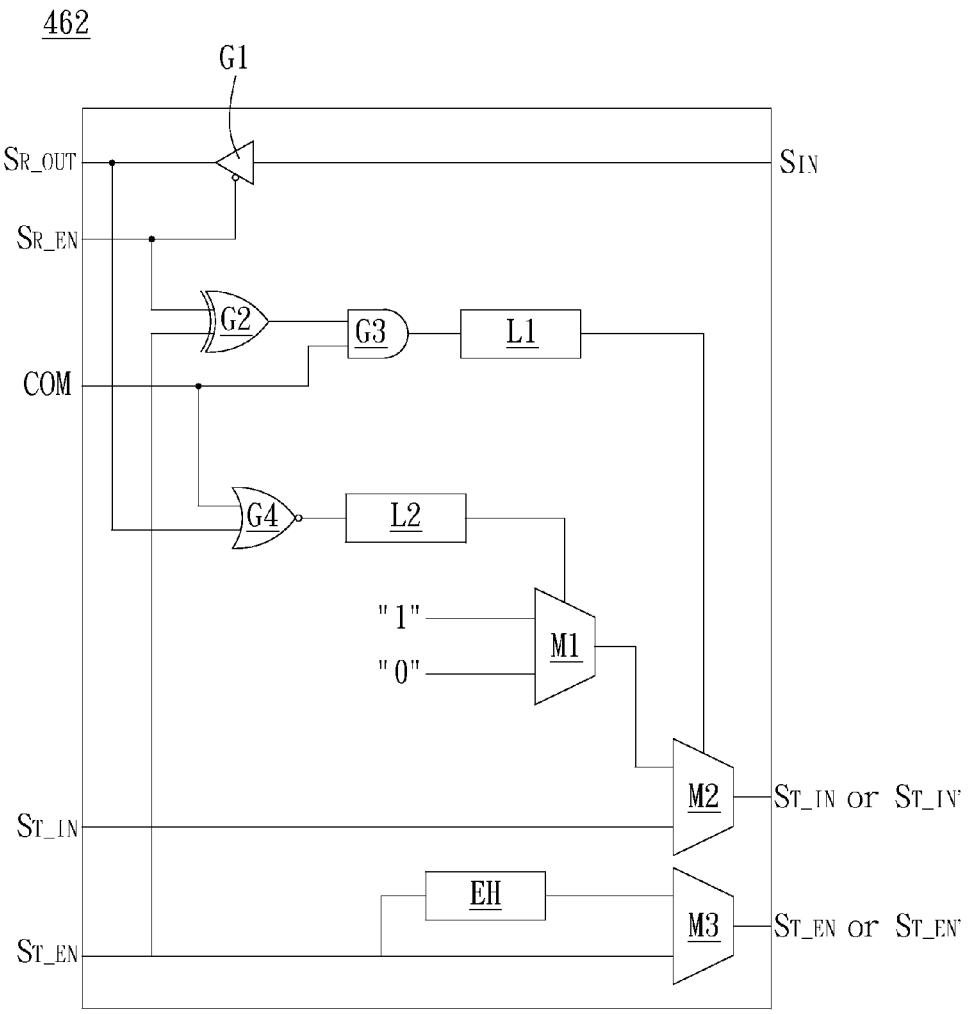
FIG. 6 illustrates a detailed schematic diagram of the enhancement determining circuit of FIG. 5.

Then, please refer to FIG. 6. FIG. 6 illustrates a detailed schematic diagram of the enhancement determining circuit 462 in FIG. 5. As shown in FIG. 6, the enhancement determining circuit 462 includes a first logic gate unit G1, a second logic gate unit G2, a third logic gate unit G3, a fourth logic gate unit G4, latch units L1~L2, multiplex units M1~M3, and an enhancing unit EH. Wherein, the first logic gate unit G1, the second logic gate unit G2, the third logic gate unit G3, and the fourth logic gate unit G4 can be a NOT gate, a XOR gate, a AND gate, and a NOR gate respectively, but not limited to this.

The first logic gate unit G1 receives the input signal $S_{IN}$ from outside and outputs a receiver output signal $S_{R\_OUT}$. Two input terminals of the second logic gate unit G2 receive the receiver enabling signal $S_{R\_EN}$ and the transmitter enabling signal $S_{T\_EN}$ respectively and an output terminal of the second logic gate unit G2 is coupled to one input terminal of the third logic gate unit G3. Another input terminal of the third logic gate unit G3 is coupled to an input terminal of the fourth logic gate unit G4 to receive the comparing result COM and an output terminal of the third logic gate unit G3 is coupled to the latch unit L1. Two input terminals of the fourth logic gate unit G4 receive the comparing result COM and the comparing result COM respectively and the output terminal of the fourth logic gate unit G4 is coupled to the latch unit L2. The latch unit L1 is coupled to the multiplex unit M2. The latch unit L2 is coupled to the multiplex unit M1. The multiplex unit M1 is coupled to the multiplex unit M2 and the multiplex unit M2 is coupled to the multiplex unit M3. The multiplex unit M2 also receives the original transmitter input signal $S_{T\_IN}$ and selectively outputs the original transmitter input signal $S_{T\_IN}$ or enhanced transmitter input signal $S_{T\_IN}'$.

The multiplex unit M3 also receives the original transmitter enabling signal $S_{T\_EN}$ and selectively outputs the original transmitter enabling signal $S_{T\_EN}$ or the enhanced transmitter enabling signal $S_{T\_EN}'$.

It should be noticed that the detection unit 46 can be selectively operated in a normal configuration, an open drain pull configuration, an open drain push configuration, or a differential open drain configuration according to the determining result of the enhancement determining circuit 462. In fact, the open drain pull configuration, the open drain push configuration, and the differential open drain configuration are different enhancing configurations and they will be introduced in detail as follows.

(1) Open Drain Push Configuration

Figure 7A:
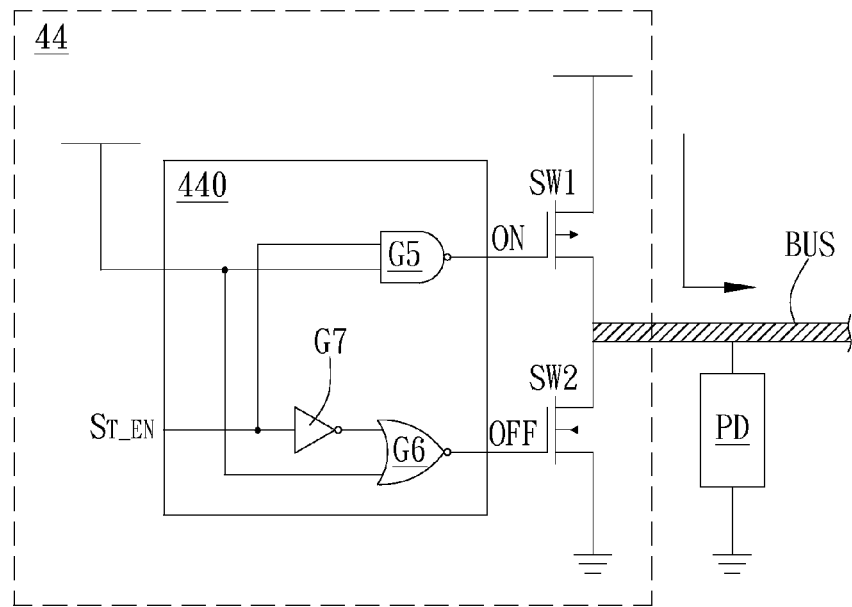
FIG. 7A and FIG. 7B illustrate schematic diagrams of the transmitting unit of the transceiver operated in an open drain push configuration.
Figure 7B:
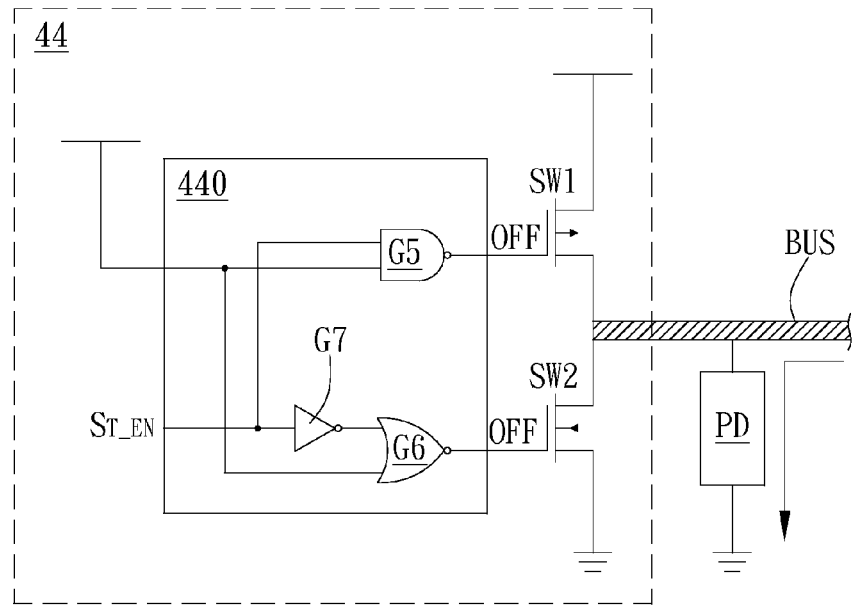

Please refer to FIG. 7A and FIG. 7B. The transmitting unit 44 of the half-duplex transceiver 4 includes a transmitter enabling logic circuit 440, a first switch SW1, and a second switch SW2. The transmitter enabling logic circuit 440 includes a fifth logic gate unit G5, a sixth logic gate unit G6, and a seventh logic gate unit G7. Wherein, input terminals of the fifth logic gate unit G5 and the seventh logic gate unit G7 both receive the transmitter enabling signal $S_{T\_EN}$; an input terminal of the sixth logic gate unit G6 is coupled to an input terminal of the fifth logic gate unit G5 and an output terminal of the seventh logic gate unit G7; output terminals of the fifth logic gate unit G5 and the sixth logic gate unit G6 are coupled to the gates of the first switch SW1 and the second switch SW2 respectively.

In fact, the fifth logic gate unit G5, the sixth logic gate unit G6, and the seventh logic gate unit G7 are a NAND gate, a NOR gate, and a NOT gate respectively, but not limited to this.

When the half-duplex transceiver 4 is operated in the open drain push configuration, the first switch SW1 is switched on and the second switch S2 is switched off, and the transmitting unit 44 only uses the fifth logic gate unit G5 to push high the level of the output signal to form the rising edge of the output signal; when the first switch SW1 is also switched off, the transmitting unit 44 will be switched off and the external circuit (e.g., a pull-low circuit PD disposed on the bus BUS) is used to pull low the level of the output signal to form the falling edge of the output signal.

Figure 7C:
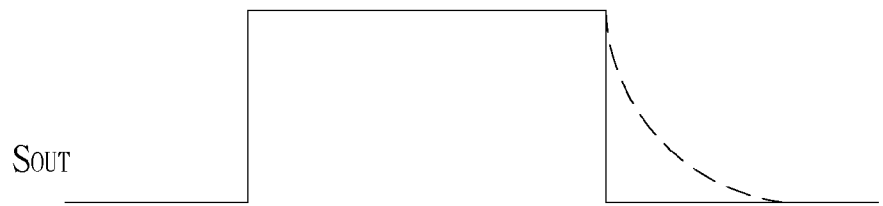
FIG. 7C illustrates the level variation of its output signal.

It should be noticed that using the external circuit to pull low the level of the output signal is too slow; for example, the falling edge of the output signal $S_{OUT}$ falls too slow as the dotted line in FIG. 7C shows. Therefore, when the enhancement determining circuit 462 of the detection unit 46 detects that the external circuit pulls low the level of the output signal, the enhancement determining circuit 462 will enhance the falling edge of the transmitter input signal $S_{T\_IN}$ and the transmitter enabling signal $S_{T\_EN}$, so that the falling edge of the transmitter input signal $S_{T\_IN}$ will fall faster to meet ideal level variation, as the solid line in FIG. 7C shows.

(2) Open Drain Pull Configuration

Figure 8A:
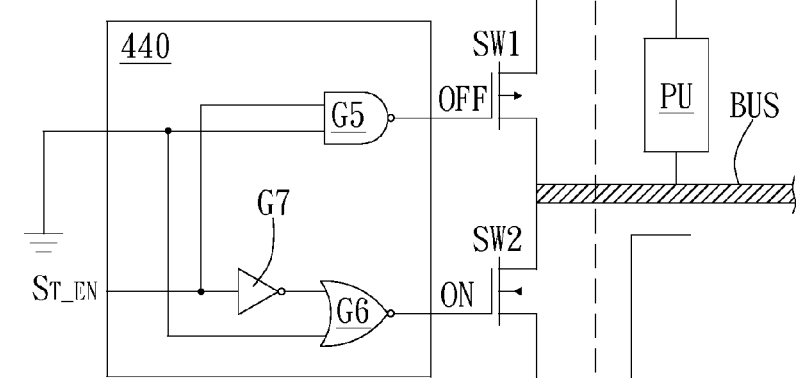
FIG. 8A and FIG. 8B illustrate schematic diagrams of the transmitting unit of the transceiver operated in an open drain pull configuration.
Figure 8B:
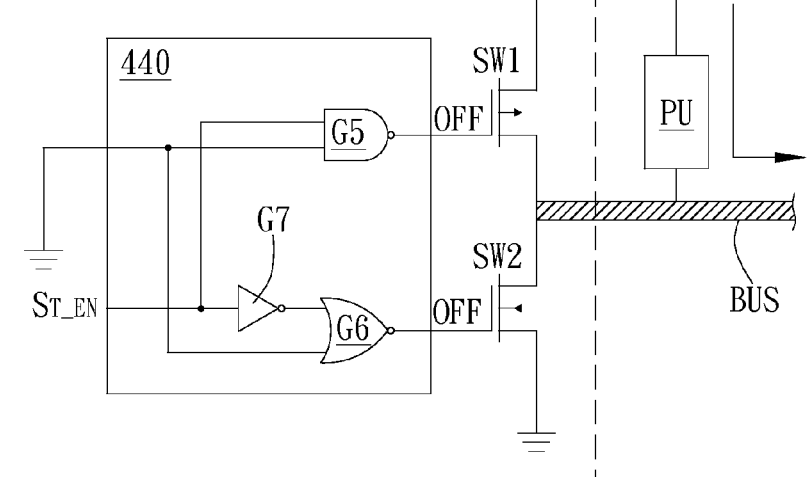

Please refer to FIG. 8A and FIG. 8B. When the half-duplex transceiver 4 is operated in the open drain pull configuration, the first switch SW1 is switched off and the second switch SW2 is switched on, and the transmitting unit 44 only uses the sixth logic gate unit G6 to pull low the level of the output signal; when the second switch SW2 is also switched off, the transmitting unit 44 will be switched off and the external circuit (e.g., a pull-high circuit PU disposed on the bus BUS) is used to push high the level of the output signal.

Figure 8C:
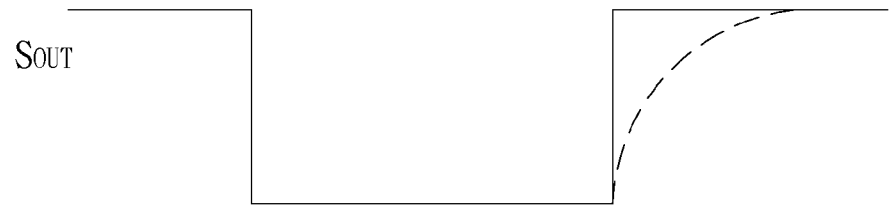
FIG. 8C illustrates the level variation of its output signal.

It should be noticed that using the external circuit to push high the level of the output signal is too slow; for example, the rising edge of the output signal $S_{OUT}$ rises too slow as the dotted line in FIG. 8C shows. Therefore, when the enhancement determining circuit 462 of the detection unit 46 detects that the external circuit pushes high the level of the output signal, the enhancement determining circuit 462 will enhance the rising edge of the transmitter input signal $S_{T\_IN}$ and the transmitter enabling signal $S_{T\_EN}$, so that the rising edge of the transmitter input signal $S_{T\_IN}$ will rise faster to meet ideal level variation, as the solid line in FIG. 8C shows.

The open drain push configuration and open drain pull configuration mentioned above are used for single-ended outputting type transceivers; in fact, the invention can be also used in differential outputting type transceivers to obtain better common-mode rejection capability.

(3) Differential Open Drain Configuration

Figure 9A:
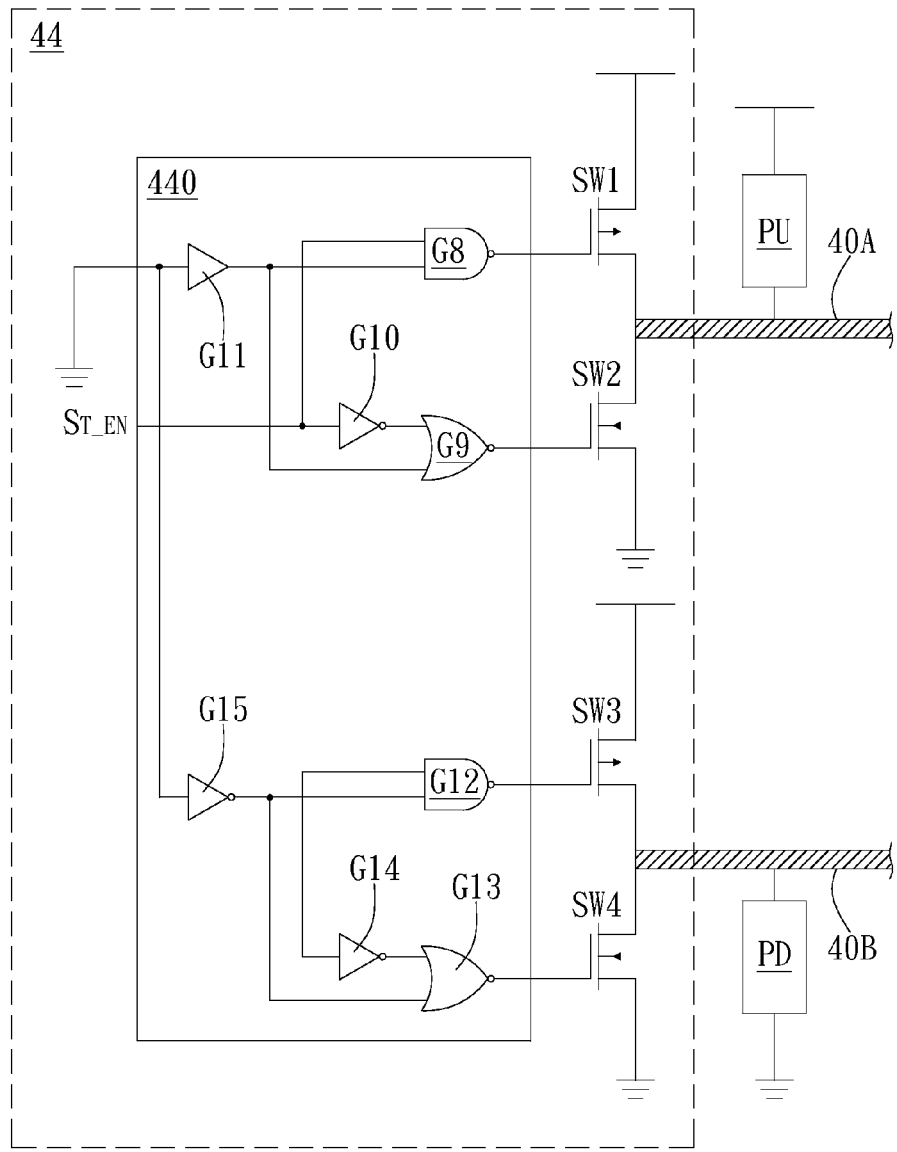
FIG. 9A and FIG. 9B illustrate schematic diagrams of the transmitting unit of the transceiver operated in a differential open drain configuration.
Figure 9B:
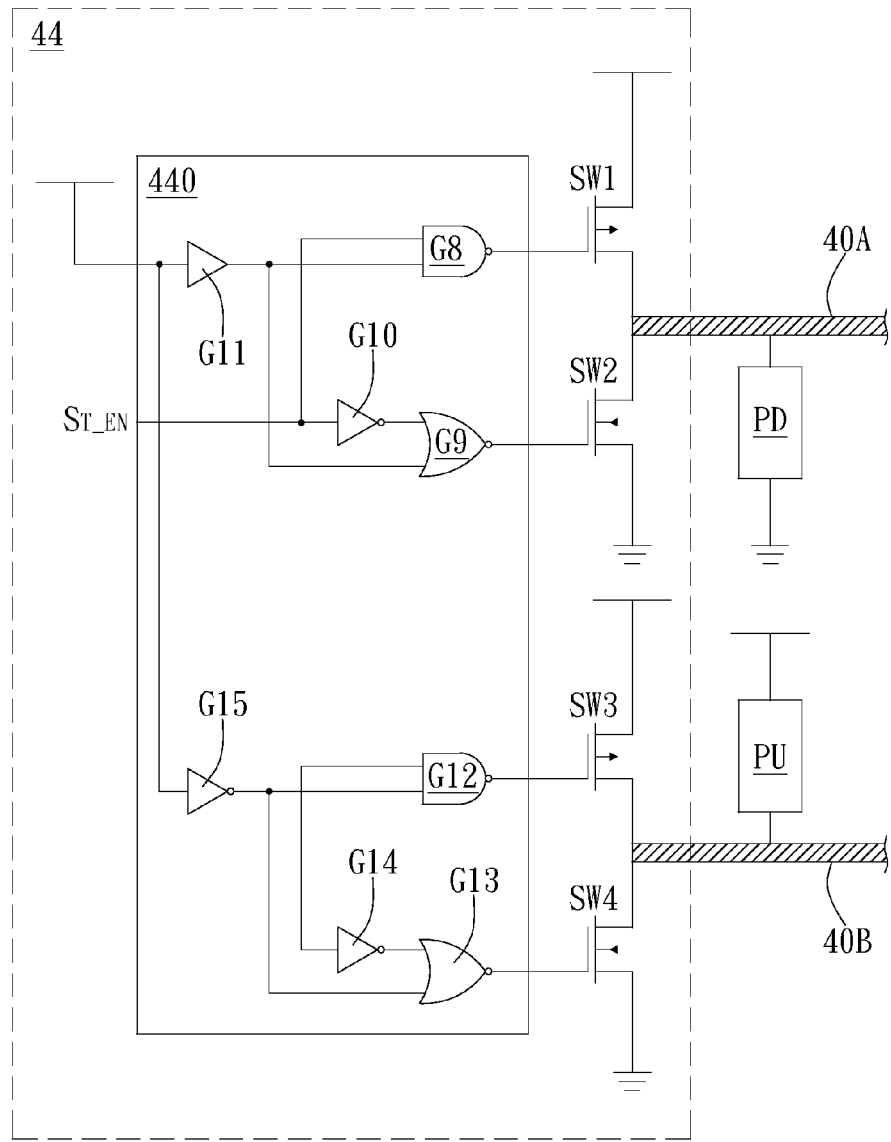

Please refer to FIG. 9A and FIG. 9B. The transmitting unit 44 of the differential outputting type half-duplex transceiver 4 includes a transmitter enabling logic circuit 440, a first switch SW1, a second switch SW2, a third switch SW3, and a fourth switch SW4. The transmitter enabling logic circuit 440 includes an eighth logic gate unit G8, a ninth logic gate unit G9, . . . , a fourteenth logic gate unit G14, and a fifteenth logic gate unit G15. Wherein, input terminals of the eleventh logic gate unit G11 and the fifteenth logic gate unit G15 are coupled; an output terminal of the eleventh logic gate unit G11 is coupled to an input terminal of the eighth logic gate unit G8 and an input terminal of the ninth logic gate unit G9 respectively; another input terminal of the eighth logic gate unit G8 is coupled to an input terminal of the tenth logic gate unit G10; input terminals of the tenth logic gate unit G10, the twelfth logic gate unit G12, and the fourteenth logic gate unit G14 all receive the transmitter enabling signal $S_{T\_EN}$; an output terminal of the tenth logic gate unit G10 is coupled to another input terminal of the ninth logic gate unit G9; an output terminal of the fifteenth logic gate unit G15 is coupled to an input terminal of the twelfth logic gate unit G12 and an input terminal of the thirteenth logic gate unit G13 respectively; an output terminal of the fourteenth logic gate unit G14 is coupled to another input terminal of the thirteenth logic gate unit G13; output terminals of the eighth logic gate unit G8, the ninth logic gate unit G9, the twelfth logic gate unit G12, and the thirteenth logic gate unit G13 are coupled to gate electrodes of the first switch SW1~the fourth switch SW4 respectively.

In fact, the eighth logic gate unit G8, a ninth logic gate unit G9, . . . , a fourteenth logic gate unit G14, and a fifteenth logic gate unit G15 can be a NAND gate, a NOR gate, a NOT gate, a NOT gate, a NAND gate, a NOR gate, a NOT gate, and a NOT gate, but not limited to this.

As shown in FIG. 9A, when an upper part and a lower part of the circuit of the transmitting unit 44 are operated in the open drain pull configuration and the open drain push configuration respectively, the first switch SW1 and the fourth switch SW4 are switched off and the second switch SW2 and the third switch SW3 are switched on, the upper part of the circuit of the transmitting unit 44 only uses the ninth logic gate unit G9 to pull low the level of a positive output signal $S_{OUT+}$ in the differential output signal and the lower part of the circuit of the transmitting unit 44 only uses the twelfth logic gate unit G12 to push high the level of a negative output signal $S_{OUT-}$ in the differential output signal. When the second switch SW2 and the third switch SW3 are also switched off, the upper part and the lower part of the circuit of the transmitting unit 44 are both switched off, and then the pull-high circuit PU disposed on the bus 40A is used to push high the level of the positive output signal $S_{OUT+}$ in the differential output signal and the pull-low circuit PD disposed on the bus 40B is used to pull low the level of the negative output signal $S_{OUT-}$ in the differential output signal.

Figure 9C:
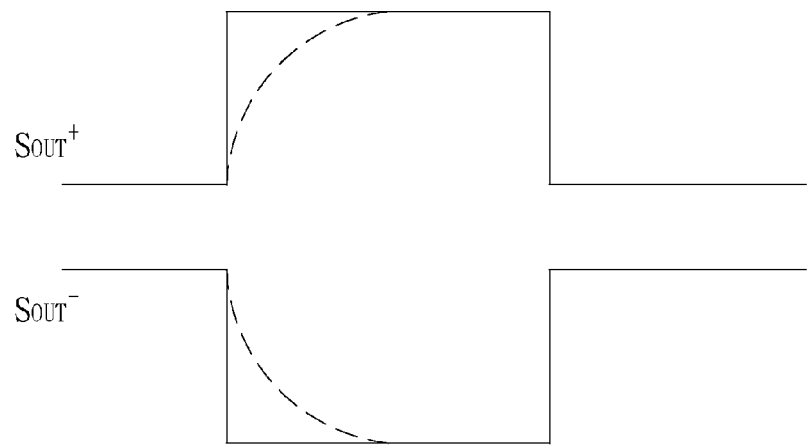
FIG. 9C and FIG. 9D illustrate the level variation of its output signal.

It should be noticed that using the external circuit to push high the level of the positive output signal $S_{OUT+}$ and pull low the level of the negative output signal $S_{OUT-}$ is too slow; for example, the rising edge of the positive output signal $S_{OUT+}$ rises too slow and the falling edge of the negative output signal $S_{OUT-}$ falls too slow as the dotted lines in FIG. 9C show. Therefore, when the enhancement determining circuit 462 of the detection unit 46 detects that the external circuit pushes high the level of the positive output signal $S_{OUT+}$ and pulls low the level of the negative output signal $S_{OUT-}$, the enhancement determining circuit 462 will enhance the rising edge of the positive output signal $S_{OUT+}$ and the falling edge of the negative output signal $S_{OUT-}$ and the transmitter enabling signal $S_{T\_EN}$, so that the rising edge of the positive output signal $S_{OUT+}$ will rise faster and the falling edge of the negative output signal $S_{OUT-}$ will fall faster to meet ideal level variation, as the solid lines in FIG. 9C shows.

Similarly, as shown in FIG. 9B, when an upper part and a lower part of the circuit of the transmitting unit 44 are operated in the open drain push configuration and the open drain pull configuration respectively, the first switch SW1 and the fourth switch SW4 are switched on and the second switch SW2 and the third switch SW3 are switched off, the upper part of the circuit of the transmitting unit 44 only uses the eighth logic gate unit G8 to push high the level of the positive output signal $S_{OUT+}$ in the differential output signal and the lower part of the circuit of the transmitting unit 44 only uses the thirteenth logic gate unit G13 to pull low the level of the negative output signal $S_{OUT-}$ in the differential output signal. When the first switch SW1 and the fourth switch SW4 are also switched off, the upper part and the lower part of the circuit of the transmitting unit 44 are both switched off, and then the pull-low circuit PD disposed on the bus 40A is used to pull low the level of the positive output signal $S_{OUT+}$ in the differential output signal and the pull-high circuit PU disposed on the bus 40B is used to push high the level of the negative output signal $S_{OUT-}$ in the differential output signal.

Figure 9D:
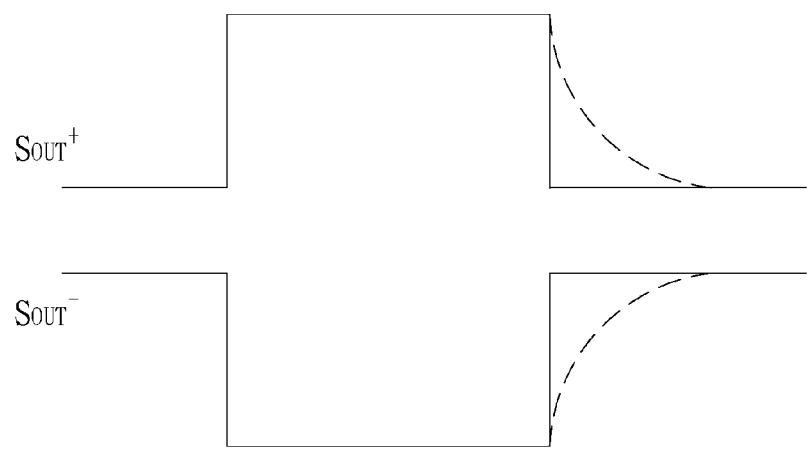

It should be noticed that using the external circuit to pull low the level of the positive output signal $S_{OUT+}$ and push high the level of the negative output signal $S_{OUT-}$ is too slow; for example, the falling edge of the positive output signal $S_{OUT+}$ falls too slow and the rising edge of the negative output signal $S_{OUT-}$ rises too slow as the dotted lines in FIG. 9D show. Therefore, when the enhancement determining circuit 462 of the detection unit 46 detects that the external circuit pulls low the level of the positive output signal $S_{OUT+}$ and pushes high the level of the negative output signal $S_{OUT-}$, the enhancement determining circuit 462 will enhance the falling edge of the positive output signal $S_{OUT+}$ and the rising edge of the negative output signal $S_{OUT-}$ and the transmitter enabling signal $S_{T\_EN}$, so that the falling edge of the positive output signal $S_{OUT+}$ will fall faster and the rising edge of the negative output signal $S_{OUT-}$ will rise faster to meet ideal level variation, as the solid lines in FIG. 9D shows.

Another embodiment of the invention is a transceiver operating method. In this embodiment, the transceiver operating method is used for operating a transceiver. The transceiver is coupled to a bus. The transceiver includes a receiving unit and a transmitting unit. The receiving unit and the transmitting unit are coupled to the bus respectively.

Figure 10:
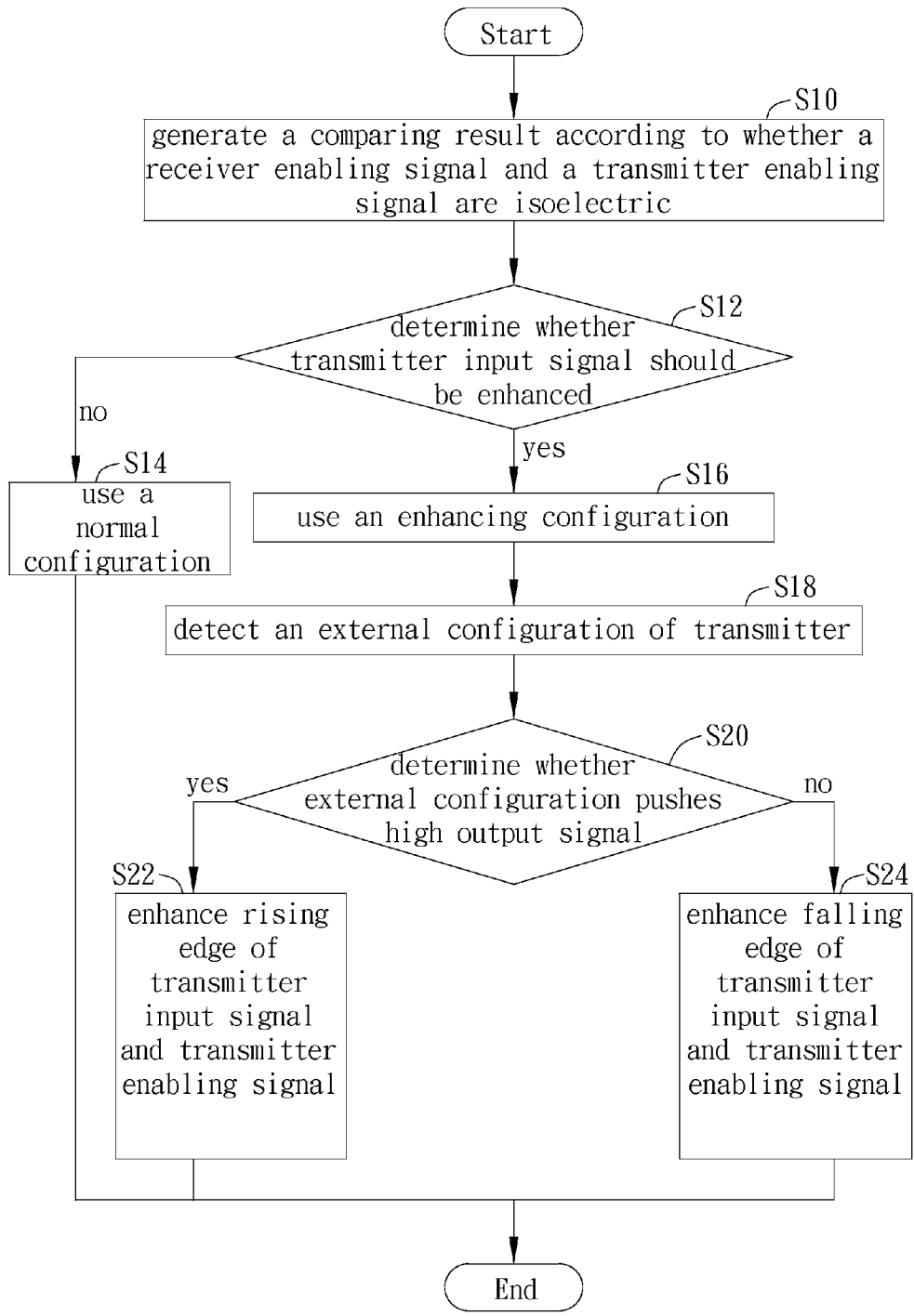
FIG. 10 illustrates a flowchart of the transceiver operating method in another embodiment of the invention.

Please refer to FIG. 10. FIG. 10 illustrates a flowchart of the transceiver operating method in this embodiment. As shown in FIG. 10, in the step S10, the method generates a comparing result according to whether a receiver enabling signal and a transmitter enabling signal are isoelectric. In fact, the transceiver can receive the receiver enabling signal and the transmitter enabling signal from a micro-processor through isolators, and the comparing result can show the configuration between the transceiver and the micro-processor, but not limited to this.

In the step S12, the method determines whether the transmitter input signal should be enhanced according to the comparing result. If the receiver enabling signal and the transmitter enabling signal are not isoelectric, the determining result of the step S12 is no, and the transmitter input signal should not be enhanced. Therefore, the method performs the step S14 to use a normal configuration, namely the conventional push-pull configuration. If the receiver enabling signal and the transmitter enabling signal are isoelectric, the determining result of the step S12 is yes, and the transmitter input signal should be enhanced. Therefore, the method performs the step S16 to use an enhancing configuration, such as an open drain push configuration, an open drain pull configuration, or a differential open drain configuration.

Under the enhancing configuration, the method performs the step S18 to detect an external configuration of the transmitter. In the step S20, the method determines whether the external configuration pushes high the level of the output signal. If the determining result of the step S20 is yes, the external configuration pushes high the level of the output signal and the pushing high rate is slow; therefore, the method will perform the step S22 to enhance the rising edge of the transmitter input signal and the transmitter enabling signal, so that the rising edge of the output signal will rise faster. If the determining result of the step S20 is no, the external configuration pulls low the level of the output signal and the pulling low rate is slow; therefore, the method will perform the step S24 to enhance the falling edge of the transmitter input signal and the transmitter enabling signal, so that the falling edge of the output signal will fall faster.

Compared to the prior arts, no matter the transceiver of the invention is used in a system having no isolator or having isolators of different numbers, the transceiver and the transceiver operating method of the invention can automatically detect the configuration out of the transceiver and dynamically enhance the signal accordingly to achieve high-speed signal transmission. By doing so, the transceiver and the transceiver operating method of the invention can effectively improve the drawback of slow signal transmission rate when the conventional transceiver is operated in the open drain configuration; therefore, the transceiver and the transceiver operating method of the invention can achieve the effects of reducing costs and high-speed signal transmission at the same time.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A transceiver, coupled to a bus, the transceiver comprising:
    a receiving unit, coupled to the bus;
    a transmitting unit, coupled to the bus; and
    a detection unit, coupled to the receiving unit and the transmitting unit respectively, for receiving a first input signal, a receiver enabling signal, and a transmitter enabling signal respectively, selectively enhancing the first input signal and the transmitter enabling signal according to a comparing result of comparing the receiver enabling signal with the transmitter enabling signal, and then transmitting the enhanced first input signal and the enhanced transmitter enabling signal to the bus through the transmitting unit.

2. The transceiver of claim 1, wherein the detection unit comprises:
    a comparing circuit, for receiving the receiver enabling signal and the transmitter enabling signal respectively and generating the comparing result according to whether the receiver enabling signal and the transmitter enabling signal are isoelectric; and
    an enhancement determining circuit, coupled to the comparing circuit, the receiving unit, and the transmitting unit respectively, for determining whether the first input signal should be enhanced and a voltage level that the first input signal should be enhanced to according to the comparing result.

3. The transceiver of claim 2, wherein if the receiver enabling signal and the transmitter enabling signal are not isoelectric, the enhancement determining circuit determines that the first input signal should not be enhanced and outputs the first input signal; if the receiver enabling signal and the transmitter enabling signal are isoelectric, the enhancement determining circuit determines that the first input signal should be enhanced and enhances the first input signal and the transmitter enabling signal, then the enhancement determining circuit outputs the enhanced first input signal and the enhanced transmitter enabling signal.

4. The transceiver of claim 3, further comprising:
    a selector, coupled between the enhancement determining circuit and the transmitting unit, for selectively transmitting the first input signal or the enhanced first input signal and the transmitter enabling signal or the enhanced transmitter enabling signal outputted by the enhancement determining circuit to the transmitting unit.

5. The transceiver of claim 3, wherein the receiving unit receives a second input signal through the bus, when the enhancement determining circuit enhances the first input signal, the enhancement determining circuit determines that a configuration of the bus is push-high or pull-low according to the second input signal, if the enhancement determining circuit determines that the configuration of the bus is push-high, the enhancement determining circuit enhances a rising edge of the first input signal; if the enhancement determining circuit determines that the configuration of the bus is pull-low, the enhancement determining circuit enhances a falling edge of the first input signal.

6. The transceiver of claim 2, wherein the detection unit further comprises:
    a pull-up circuit and/or a pull-down circuit, coupled to a receiving terminal of the comparing circuit.

7. The transceiver of claim 1, wherein the detection unit is operated in a normal configuration, an open drain pull configuration, an open drain push configuration, or a differential open drain configuration.

8. A transceiver operating method, for operating a transceiver, the transceiver being coupled to a bus, the transceiver comprising a receiving circuit, a detection circuit, and a transmitting circuit, the receiving circuit and the transmitting circuit being coupled to the bus respectively, the transceiver operating method comprising steps of:
    (a) the detection circuit comparing a receiver enabling signal with a transmitter enabling signal to generate a comparing result, wherein the receiver enabling signal and the transmitter enabling signal are received by the transceiver; and
    (b) the detection circuit selectively enhancing a first input signal and the transmitter enabling signal according to the comparing result and then transmitting the enhanced first input signal and the enhanced transmitter enabling signal to the bus.

9. The transceiver operating method of claim 8, wherein the step (a) generates the comparing result according to whether the receiver enabling signal and the transmitter enabling signal are isoelectric and the step (b) determines whether the first input signal should be enhanced and a voltage level that the first input signal should be enhanced to according to the comparing result.

10. The transceiver operating method of claim 9, wherein if the receiver enabling signal and the transmitter enabling signal are not isoelectric, the step (b) determines that the first input signal should not be enhanced and the transceiver operating method outputs the first input signal; if the receiver enabling signal and the transmitter enabling signal are isoelectric, the step (b) determines that the first input signal should be enhanced, the transceiver operating method enhances the first input signal and the transmitter enabling signal and then outputs the enhanced first input signal and the enhanced transmitter enabling signal.

11. The transceiver operating method of claim 10, wherein the receiving circuit receives a second input signal through the bus, when the transceiver operating method enhances the first input signal, the transceiver operating method determines that a configuration of the bus is push-high or pull-low according to the second input signal, if the transceiver operating method determines that the configuration of the bus is push-high, the transceiver operating method enhances a rising edge of the first input signal; if the transceiver operating method determines that the configuration of the bus is pull-low, the transceiver operating method enhances a falling edge of the first input signal.

12. The transceiver operating method of claim 8, wherein the transceiver is operated in a normal configuration, an open drain pull configuration, an open drain push configuration, or a differential open drain configuration.

\* \* \* \* \*